United States Patent [19]

Frerking

[11] 4,305,041

[45] Dec. 8, 1981

[54] TIME COMPENSATED CLOCK OSCILLATOR

[75] Inventor: Marvin E. Frerking, Cedar Rapids, Iowa

[73] Assignee: Rockwell International Corporation, El Segundo, Calif.

[21] Appl. No.: 88,732

[22] Filed: Oct. 26, 1979

[51] Int. Cl.³ .................... H03K 5/26

[52] U.S. Cl. .................... 328/155; 328/61; 328/63

[58] Field of Search .................... 328/55, 61, 63, 155

[56] References Cited

U.S. PATENT DOCUMENTS

| | | | |
|---|---|---|---|
| 3,308,387 | 3/1967 | Hackett | 328/155 |
| 3,458,823 | 7/1969 | Nordahl | 328/155 |
| 3,806,822 | 4/1974 | Meyer et al. | 328/55 |
| 4,024,416 | 5/1977 | Fujita et al. | 328/61 X |
| 4,222,013 | 9/1980 | Bowers et al. | 328/155 X |

*Primary Examiner*—John S. Heyman
*Attorney, Agent, or Firm*—Richard K. Robinson; Howard R. Greenberg; H. Fredrick Hamann

[57] ABSTRACT

A time compensated clock oscillator is disclosed that has a first low power oscillator that drives an output device such as a time-of-day clock, a second more precise oscillator whose output is compared to the output of the first oscillator, and develops a correction signal that is used to periodically correct the output device.

11 Claims, 4 Drawing Figures

TIME COMPENSATED CLOCK OSCILLATOR

The Government has rights in this invention pursuant to Contract No. DAAB07-78-C-0160 awarded by the Department of the Army.

BACKGROUND OF THE INVENTION

This invention relates to time compensated clock ascillator circuits.

There are many current applications for oscillator circuits that require a high degree of accuracy in their output. An example of one application is a time-of-day clock used in a secure communication system.

In the prior art, the stringent accuracy requirements for an oscillator such as a crystal oscillator or a voltage controlled oscillator, required the selection of precision components, elaborate temperature control schemes, and relatively large quantities of power to drive the circuits. In the case of a portable device, such as a portable radio, that is required to synchronize its transmissions with a precision time-of-day clock, then the aforementioned requirements for building a precision clock oscillator become very prohibitive, not only in the areas of expense, but also in the area of power consumption. The accuracy for a time-of-day clock, that is used to synchronize a field radio that periodically changes frequency, often is in the area of less than one part per million. Thus, it is very difficult to be able to provide an accurate time-of-day clock that is reasonably priced and operates on relatively low power.

SUMMARY OF THE INVENTION

A time compensated clock oscillator is disclosed that has a first low power oscillator that drives an output device, such as a time-of-day clock, a second more precise oscillator whose output is compared to the output of the first oscillator. A correction signal is developed and is used to periodically correct the output device. The basic low power oscillator is continuously running, whereas the second oscillator, as well as the comparator circuit, may only be periodically enabled.

The first oscillator can be a low power operating frequency standard, which is of relatively modest stability and it drives the output device such as the time-of-day clock. Its accuracy is only sufficient to keep the time between corrections. The second frequency oscillator is a highly stable reference frequency standard which may be pulsed periodically to determine the instantaneous frequency of the low power first oscillator. A comparison means is used to determine the frequency difference between the low power oscillator and the reference oscillator. The difference is used to generate a correction signal that is applied to the output device, which is, of course, driven by the low powered oscillator circuit. Implementing this circuit requires that the output device, such as the time-of-day clock, be capable of accepting time corrections. In addition, a duty cycle switch may be included, to periodically turn on and off the reference frequency standard, the frequency comparison circuitry and the means for generating the correction signal.

BRIEF DESCRIPTION OF THE DRAWINGS

The invention is illustrated in the accompanying drawings wherein.

DETAILED DESCRIPTION OF THE PREFERRED EMBODIMENT

Figure 1:
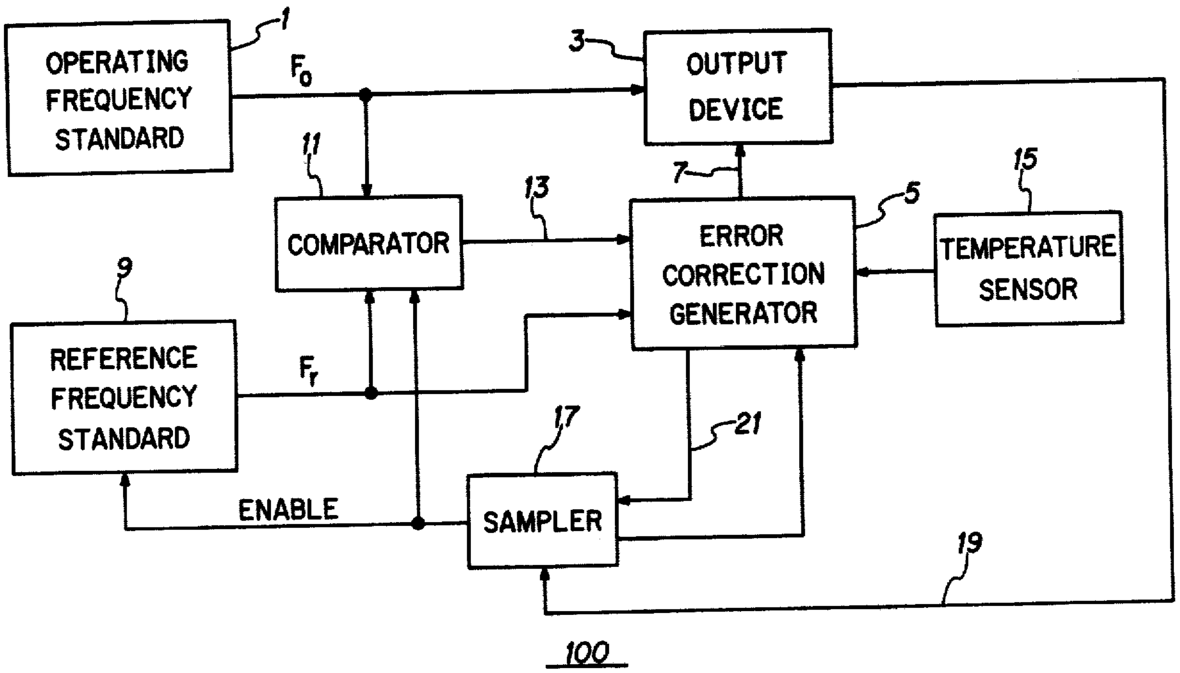
FIG. 1 is a block diagram of a time compensated clock oscillator according to the invention.

A block diagram of the time compensated clock oscillator 100 is shown in FIG. 1 to which reference should now be made. The operating frequency standard 1 drives the output device 3 which can be a device such as a time-of-day clock that keeps real time. The operating frequency standard is usually a moderately accurate frequency standard which, in the preferred embodiment, is of low cost, small size and low power consumption. The frequency $F_o$ of the operating frequency standard is measured by the comparator 11 with respect to the reference frequency $F_r$ that is generated by the reference frequency standard 9 to determine the difference. The comparator 11 can be any one of several devices, such as a divider network, that divides the frequency $F_r$ down to low reference, for example, 1 hertz, and uses the divided frequency to control a gate which allows the frequency $F_o$ to enter a counter, or can be a device such as that shown in FIGS. 2 and 3 which will be discussed later. In any event, the comparator 11 generates a difference signal and applies it to the error correction generator 5 by means of connection 13. The error correction generator 5 periodically applies a correcting signal to the output device 3. It should be noted at this time that the output device 3 must be capable of accepting time corrections.

In the cases where it is desirable to have temperature compensation, there is provided a temperature sensor 15 that provides the current temperature reading to the error correction generator 5. The error correction generator 5 uses the temperature provided by the temperature sensor 15 to normalize the reference frequency standard 9 to ambient temperature.

As a means of reducing the power consumption of the overall circuitry, sampler 17 can be utilized. This sampler 17 provides an enabling signal to the reference frequency standard 9, the comparator 11 and the error correction generator 5. The output device 3, every selected period, such as every 60 seconds, will provide an enable signal to the sampler 17 by means of connection 19. The sampler 17 then causes the operating voltages to be applied to the above enumerated devices enabling them for a short period of time, such as one second or until reset at the completion of the correction of the output device. In which case, after the error correction generator has determined the correction factor and updated the output device according to the correction factor, it will at that point reset the sampler 17, which in turn removes the power from the reference frequency standard, the comparator, the sampler and the error correction generator. The reset signal is conducted to the sampler from the error correction generator by connection 21.

If the elapsed time between samples that is provided by the sampler 17 is denoted as $T_e$ and as indicated by the output device 3, then it can be shown that the correction required to the output device 3 after M readings is:

$$\text{Time Correction} = T_e\left[\sum_{N=1}^{M}(\Delta F_n) - \sum_{N=1}^{M}(\Delta F_n)^2\right]$$

where $\Delta F_n$ is the nth frequency. It should be noted that the above equation is shown for time; the reciprocal of the correction will provide for frequency correction.

Because of the statistical properties of the frequency error $\Delta F$, the accuracy of the time correlation is much greater than would be expected from the standard deviation of $\Delta F$ and improves as $$\frac{1}{\sqrt{M}}$$

where M is the number of time interval averages. For a long period, such as a week, if measurements are made once a minute, the improvement factor is 100:1.

Figure 2:
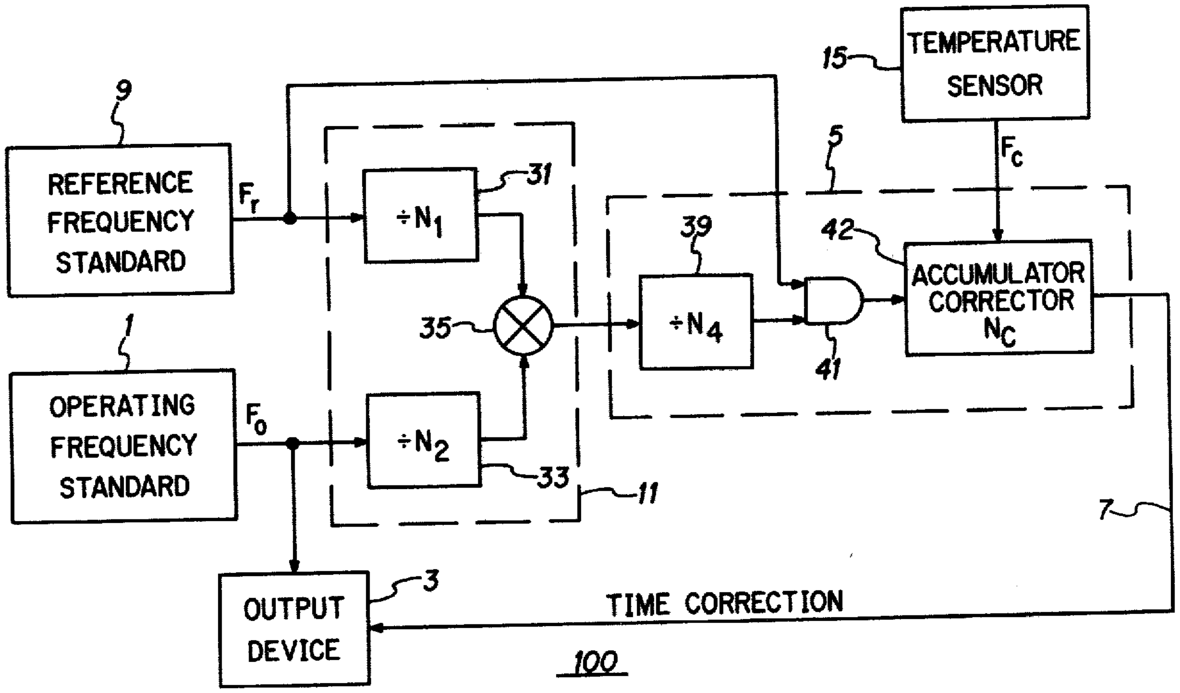
FIG. 2 is a logic diagram of the comparator and error correction circuitry of the clock oscillator of FIG. 1.

FIG. 2 is a more detailed embodiment of the invention of FIG. 1 and shows a reference frequency standard 9, which provides a frequency $F_r$ and an operating frequency standard 1, which provides an operating frequency $F_o$. The two frequencies, $F_r$ and $F_o$, in this embodiment of the invention are mixed by the mixer 35 to form a beat frequency. The beat frequency is used to provide a gating signal to the AND gate 41. The frequencies are normalized within the comparator 11 by means of the divider network 31 for the reference frequency standard which divides the reference frequencies $F_r$ by $N_1$ and divider 33 which divides the operating frequency $F_o$ by $N_2$. The values $N_1$ and $N_2$ are dependent upon the frequency and the desired gating rate. The resulting beat frequency that is provided on the output of the mixer 35 can be divided down within the error correction generator 5 by means of the divider 39 which divides the heat frequency by $N_4$. The resulting gate signal is ANDed by $F_r$ by AND gate 41 and the output is applied to the accumulator/corrector 42 within the error correction generator 5. In addition, the temperature compensation $F_c$ from the temperature sensor 15 can also be accumulated within the accumulator/corrector 42 if temperature compensation is a requirement. The accumulator/corrector 42 provides the time correction signal to the output device 3 by way of connection 7. As in the case of FIG. 1, the operating frequency standard is applied directly to the output device 3.

In FIG. 2, $F_o$ is related to $F_r$ by $$F_o = F_r\left[R_1 \pm \frac{R_2}{N_c}\right]$$

where $R_1$ is the division following $F_o$ divided by the division following $F_r$. $R_2$ is the product of the division following $F_o$ multiplied by the division following the mixer 35, and $N_c$ is the number in the accumulator/corrector 42. The equation shown above can be expanded to show that $F_o$ has a greater accuracy than the circuitries resulting from a frequency counter alone.

The reference frequency standard 9 may be a conventional high stability temperature compensated crystal oscillator whose frequency is designed to be corrected, or it may be an uncompensated crystal oscillator whose temperature is known and can be referenced by the error connection generator 5 and adjusted when a temperature sensor provides divergent temperatures. It is only necessary to sense the temperature, compare the actual frequency and adjust the count in the accumulator/corrector 42 to correct for the temperature versus frequency change.

One of the main advantages is that the precision reference oscillator need not actually be at the clock drive frequency. Not having to pull the reference oscillator to a specific frequency enables it to be built in a more stable manner, i.e. does not require a varactor or trimmer capacitor and crystals that are too stiff to pull to frequency be used. The current state of the art in semiconductors, especially microprocessors time compensation can readily be implemented with a microprocessor. The microprocessor would find the frequency correction necessary for the frequency reference at the temperature by a lookup table, interpolation, or curve fitting and determine the operating frequency by the equation $$F_o = (F_r + C)\left[R_1 \pm \frac{R_2}{N_c}\right].$$

In the cases where temperature correction is provided, the relative frequency error of $F_o$ can be defined as $$\Delta F = \frac{F_o - (\text{Nominal } F_o)}{(\text{Nominal } F_o)}.$$

Figure 3:
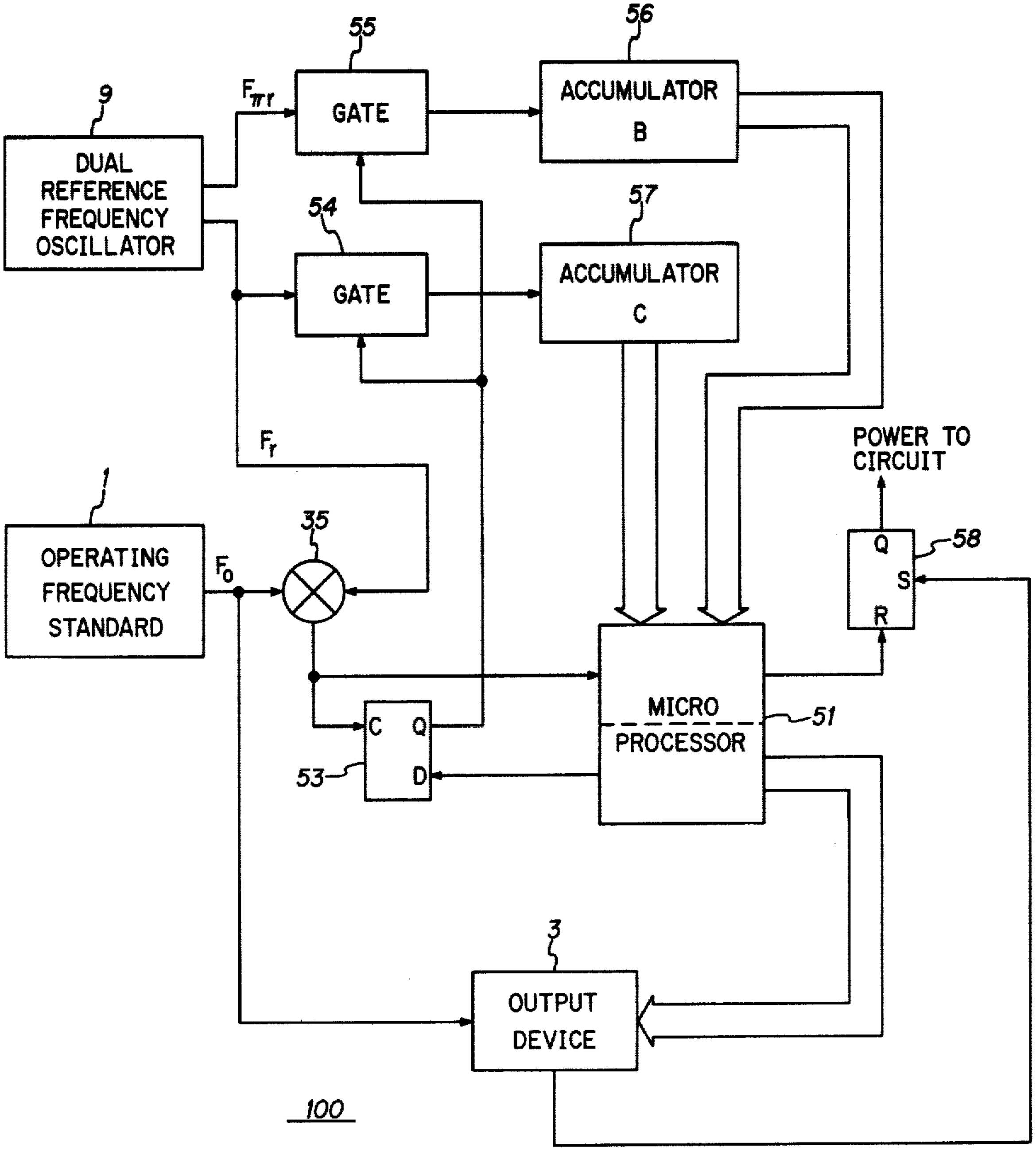
FIG. 3 is a block diagram of an alternate embodiment of the time compensated clock oscillator of FIG. 1.

In FIG. 3, a block diagram of another embodiment of the invention that incorporates the techniques disclosed above is shown which provides for the replacement of the temperature sensor 15 by the dual reference frequency oscillator 9, and the functions performed by the comparator 11 and the error correction generator 5 are performed by the microprocessor 51.

The dual reference frequency oscillator 9, as was discussed in the descriptions of FIGS. 1 and 2, provides the reference frequency $F_r$ to the mixer 35. In addition, the dual reference oscillator 9 provides a second reference frequency, $F\pi r$, whose spurious modes in combination with $F_r$ are periodically counted by the combinations of the gates 54 and 55 and the accumulators 56 and 57. The accumulated counts are applied from the accumulator B 56 and the accumulator C 57 to the microprocessor 51 which can perform the extrapolation of the temperature correction for the reference frequencies. A more detailed discussion of this method of temperature compensation is provided in U.S. Pat. No. 4,079,280 issued on Mar. 14, 1978 for the case where the dual mode oscillator uses a TTC cut crystal. The microprocessor 51 also provides the enable signal to the RS flip-flop 58 which enables the power to the circuitry and flip-flop 53 which is clocked by the beat signal that results from the mixing of the reference frequency $F_r$ with the operating frequency $F_o$ by mixer 35. When the microprocessor 51 enables the D input of the flip-flop 53 and then in response to the beat signal that is provided by the mixer 35, the flip-flop 53 provides the gating signals to the gates 54 and 55. The microprocessor, in addition to performing the temperature compensation that is determined by the accumulated counts in the accumulator 56 and 57, performs the division $N_4$ previously performed by the error correction generator 5. In addition, of course, the operating frequency standard 1 is used to drive the output device 3.

At initiation of the update of the output device, for example, every second or every minute or every hour, the output device provides a set signal to the RS flip-flop 58 which provides the power to the microprocessor 51, the gating signals and the remainder of the circuit. At the completion of the update of the output device by the microprocessor 51, the RS flip-flop 58 is reset and power is removed from all of the operating circuitries with the exception of the operating frequency standard and the output device.

Figure 4:
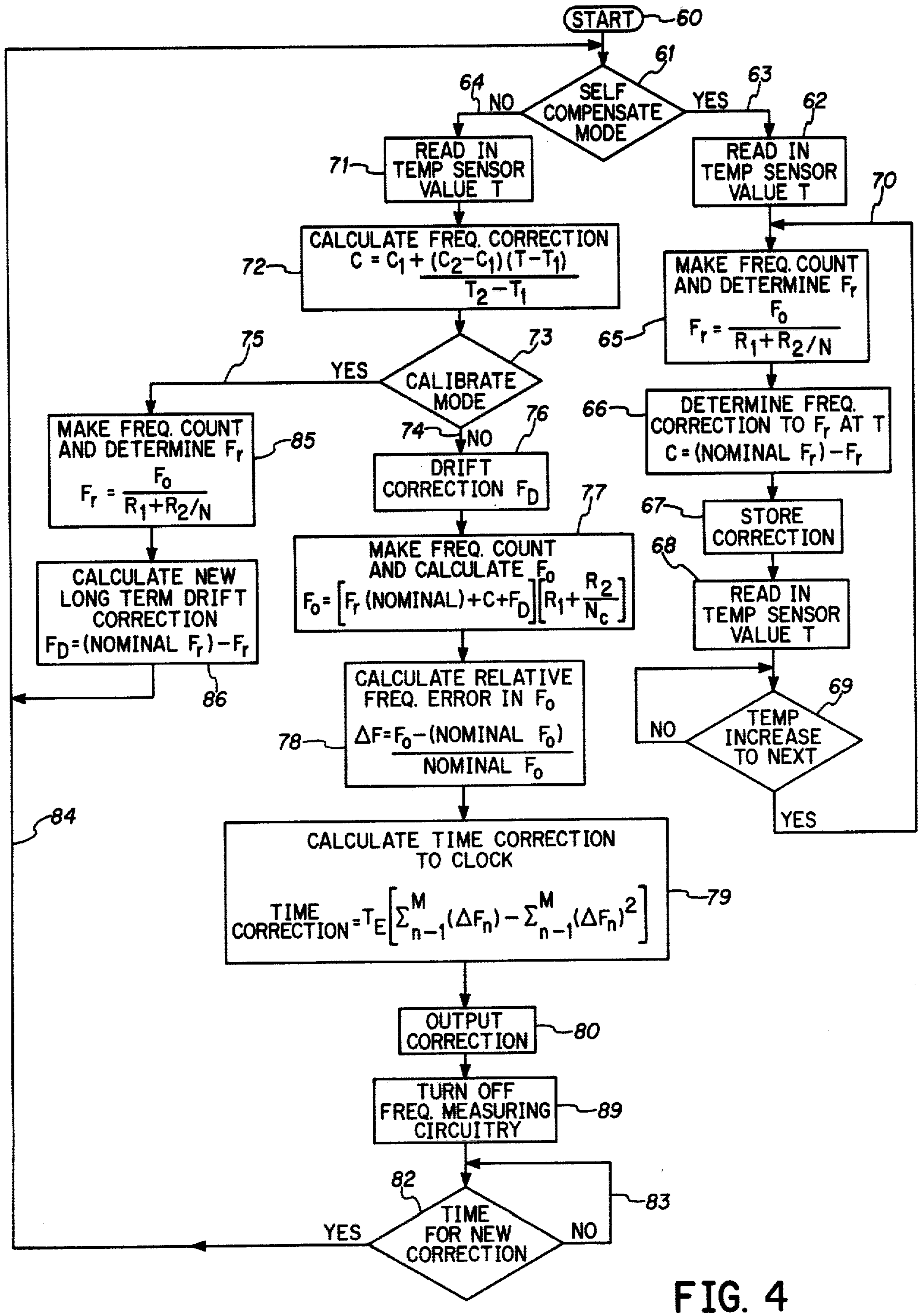
FIG. 4 is a flow diagram of the functions performed by the embodiment of the time compensated clock oscillator of FIG. 3.

It can be seen from the above discussion, that the embodiment shown in FIG. 3 provides a temperature compensated as well as a time compensated frequency controlled output device, that because of periodically updating, requires only a minimal amount of power. A flow diagram of the above discussion including FIGS. 1, 2 and 3 is provided in FIG. 4. The system is initialized at the start point 60 and the first decision block 61 decides if the unit is operating in the self compensate mode. The self compensate mode enables the unit to build the temperature correction table $T_1$, $C_1$; $T_2$, $C_2$,—$T_n$ $C_n$ (where $C_1$ is the correction for temperature correction for temperature $T_1$ and the table includes 1 through n temperatures and corrections) by externally supplying the nominal frequency $F_o$ to the unit while it is exposed to the full range of ambient temperatures. In the self compensate mode, the device implements loop 63, and the first step 62, is to read the temperature T from the sensor into the system. Since the gate period for counting is variable, the ratio of the value in accumulator B to the value in accumulator C is used to represent temperature. It should be noted that the temperature sensor for FIG. 4 can be any of the temperature sensors discussed above. The block 65 makes the frequency count and determines $F_r$ by the enumerated equation in block 65 and was discussed earlier in the specification. After $F_r$ is determined, the next functional block determines the frequency correction C at temperature T. Block 67 provides for storing the correction or accumulating the correction until it is ready to be used in a device such as a random access memory, which can be made up either by a commercially available random access memory, shift registers or other logic elements. Block 68 provides for sampling the temperature sensor. Decision block 69 makes the decision if there has been a change between the two temperatures of sufficient magnitude so that a new correction be stored. If not, the device loops on itself. If there has been a change in the temperature, then the feedback loop 70 returns to the beginning of functional block 65 where the frequency count is determined and the correction for the temperature is determined.

If the device is not in the self compensating mode, then loop 64 is used and again the first step is to read the temperature sensor at block 71. After that, the frequency correction is determined at block 72 and then the decision block 73 decides if calibration it should make for long term aging in which case, loop 75 is used. If no calibration is to be made, loop 74 is used. Following loop 74, the first step is to determine the stored long term drift correction $F_D$ as indicated in block 76. In the case of loop 74, it is assumed that there is provided either a lookup table or a chart for determining this correction. The next functional block makes the frequency count and calculate $F_o$ by the equation in block 77. After the calculation of $F_o$ has been determined, then the delta frequency is provided in block 78. The time is then corrected. The time correction is determined in block 79, the output device is updated at functional block 80 and the frequency measuring circuit is disabled at functional block 89. The circuitry loops on itself at the decision block 82 until it determines it is time to provide another correction, in which case feedback loop 84 returns to the decision block 61.

In the case where the calibrate mode is utilized, loop 75 is used and a nominal frequency $F_o$ is externally supplied to the unit. The functional block 85 determines the reference frequency by the equation provided therein and discussed previously in the specification. After the reference frequency is determined, the long term drift $F_D$ is determined at functional block 86 and after the calculation of the long term frequency drift is completed, then the loop 84 returns to the beginning of the self compensated mode decision block 61. The use of a digital aging correction $F_D$ results in a significant accuracy improvement over the prior art in which analog corrections are made to a reference oscillator. Such analog corrections tend to change the temperature compensation required and degrade the subsequent frequency stability over the temperature range.

Although the invention has been described and illustrated with a certain degree of particularity, it is understood that numerous changes in the arrangement and combination may be resorted to without departing from the spirit and scope of the invention as hereinafter claimed.

I claim:

1. A time compensated clock oscillator, comprising:
- means for generating a first and second frequency;
- means for comparing the first frequency with the second frequency including, means for mixing the first frequency with the second frequency to obtain a beat frequency, and means for combining the beat frequency with the second frequency;
- means for generating a correction signal that results from the comparison of the first frequency with the second frequency; and
- an output device controlled by the first frequency and the correction signal.

2. The time compensated clock oscillator according to claim 1, further comprising:
- means for sensing the temperature of at least the means for generating the second frequency; and
- means for implementing a temperature correction to at least the second frequency.

3. The time compensated clock according to claims 1 or 2, further comprising:
- means for periodically enabling the means for generating the second frequency.

4. The time compensated clock according to claim 3, further comprising:
- means for periodically enabling the means for comparing the first frequency with the second frequency.

5. The time compensated clock according to claim 1, further comprising:
- means for periodically enabling the means for generating the correction signal.

6. A method for time compensating a clock oscillator comprising:
- generating a first and second frequency;
- comparing the first frequency with the second frequency including the steps of mixing the first frequency with second frequency to obtain a beat frequency, and combining the beat frequency with the second frequency;

generating a correction signal that results from the comparison of the first frequency with the second frequency;

controlling an output device with the first frequency and the correction signal.

7. The method according to claim 6 further comprising the steps of sensing the temperature during the step of generating a second frequency; and implementing the temperature correction to at least a second frequency.

8. The method according to claims 6 or 7, comprising the step of;

periodically enabling the means for generating the second frequency.

9. The method according to claim 8, further comprising the steps of periodically enabling the means for comparing the first frequency with the second frequency.

10. The method according to claim 8, further comprising the step of;

enabling the means for generating a correction signal.

11. The time compensated clock oscillator according to claim 1 wherein the means for comparing the first frequency with the second frequency further comprises:

a first normalizer means for normalizing the first frequency by dividing the first frequency by a first preselected number, $N_1$; and a second normalizer means for normalizing the second frequency by dividing the second frequency by second preselected number, $N_2$.

* * * * *